United States Patent
Inoue

(10) Patent No.: US 10,460,907 B2
(45) Date of Patent: Oct. 29, 2019

(54) ELECTRON BEAM SURFACE MODIFICATION APPARATUS

(71) Applicant: Sodick Co., Ltd., Kanagawa (JP)

(72) Inventor: Motohiro Inoue, Kanagawa (JP)

(73) Assignee: Sodick Co., Ltd., Kanagawa (JP)

( * ) Notice: Subject to any disclaimer, the term of this patent is extended or adjusted under 35 U.S.C. 154(b) by 0 days.

(21) Appl. No.: 16/000,898

(22) Filed: Jun. 6, 2018

(65) Prior Publication Data

US 2019/0006148 A1 Jan. 3, 2019

(30) Foreign Application Priority Data

Jun. 28, 2017 (JP) .................. 2017-126558

(51) Int. Cl.
*H01J 37/30* (2006.01)
*H05H 1/24* (2006.01)
*H05H 1/48* (2006.01)

(52) U.S. Cl.
CPC ............... *H01J 37/30* (2013.01); *H05H 1/24* (2013.01); *H05H 1/48* (2013.01)

(58) Field of Classification Search
None
See application file for complete search history.

(56) References Cited

U.S. PATENT DOCUMENTS

| | | | | |
|---|---|---|---|---|
| 3,890,503 A * | 6/1975 | Brewster | .................. | H01J 3/021 378/122 |
| 3,921,022 A * | 11/1975 | Levine | .................. | H01J 1/3042 313/309 |
| 5,013,902 A * | 5/1991 | Allard | .................... | H01J 31/505 250/214 VT |
| 5,635,791 A * | 6/1997 | Vickers | .................... | H01J 3/022 313/309 |
| 5,903,804 A * | 5/1999 | Kirkpatrick | .............. | B41J 2/395 313/309 |
| 2003/0143356 A1* | 7/2003 | Morikawa | .............. | B82Y 10/00 428/36.91 |
| 2006/0131692 A1* | 6/2006 | Saitoh | ..................... | H01J 63/02 257/565 |
| 2008/0191607 A1* | 8/2008 | Kawai | .................... | C09K 11/54 313/503 |

(Continued)

FOREIGN PATENT DOCUMENTS

JP 2006344387 12/2006
JP 2006344387 A * 12/2006

(Continued)

*Primary Examiner* — Andrew Smyth
(74) *Attorney, Agent, or Firm* — JCIPRNET

(57) ABSTRACT

It is difficult to perform surface modification by irradiating a side surface of a hole formed on an irradiated object with a low-energy-density electron beam. An irradiated object having an irradiation hole formed thereon is disposed in a vacuum chamber. A cathode electrode is arranged to face a side surface of the irradiation hole. The cathode electrode has a large number of metal projections over an entire surface of a base body, the base body facing at least the side surface of the irradiation hole. A conductive mesh is arranged between the cathode electrode and the side surface of the irradiation hole. The conductive mesh partially contacts the irradiated object and is set to have the same potential as the irradiated object.

8 Claims, 2 Drawing Sheets

(56) References Cited

U.S. PATENT DOCUMENTS

2009/0159074 A1* 6/2009 Rabinowitz .............. G02B 5/08
126/600

FOREIGN PATENT DOCUMENTS

| JP | 2010100904 | | 5/2010 |
| JP | 2010100904 A | * | 5/2010 |
| JP | 5187876 | | 4/2013 |
| JP | 5187876 B2 | * | 4/2013 |

* cited by examiner

US 10,460,907 B2

ELECTRON BEAM SURFACE MODIFICATION APPARATUS

CROSS-REFERENCE TO RELATED APPLICATION

This application claims the priority benefit of Japan Patent Application No. 2017-126558, filed on Jun. 28, 2017. The entirety of the above-mentioned patent application is hereby incorporated by reference herein and made a part of this specification.

BACKGROUND

Technical Field

The disclosure relates to an electron beam surface modification apparatus which irradiates an irradiated object with an electron beam of low energy density to modify a surface of the irradiated object. Particularly, the disclosure relates to an electron beam surface modification apparatus capable of modifying a side surface of a hole formed on the irradiated object.

Related Art

There is known an electron beam surface modification apparatus which generally forms an electron column several tens of mmϕ in diameter and irradiates a surface of an irradiated object with a low-energy-density and large-area electron beam. As representatively disclosed in Japanese Laid-open No. 2006-344387, in an electron beam surface modification apparatus capable of obtaining an electron column of large area compared with so-called spot irradiation which scans an electron beam of an electron column less than several mmϕ in diameter, a cathode electrode and a collector electrode are arranged on a vertical line, and a ring-shaped anode electrode and a solenoid are provided between the cathode electrode and the collector electrode.

In such an electron beam surface modification apparatus, electrons are excited by a plasma generated at the anode. The electrons are focused and accelerated by a magnetic field formed at the solenoid, and a large quantity of electrons arrive at the collector which is far away from the cathode, while retaining irradiation energy. At this moment, the electrons attempt to move through the shortest path in linear distance between the cathode and the collector. Hence, in the case where a hole is formed on the irradiated surface of the irradiated object, many electrons are concentrated around an entrance (especially at an edge) of the hole, most of the remaining electrons collide with a bottom surface of the hole, and a portion with which the electrons have collided is modified. Hereinafter, the hole formed on the irradiated surface of the irradiated object is simply referred to as "irradiation hole."

Given this situation, in the electron beam surface modification apparatus, it is difficult to irradiate an electron beam uniformly over an entire surface, including the bottom surface and a side surface, of the irradiation hole. However, it does not mean that the electrons do not collide with the side surface of the irradiation hole at all. For example, in the case of a relatively shallow irradiation hole having a flat and circular bottom surface and a depth-to-diameter ratio of 1 to 1, it is clear that the side surface of the irradiation hole can be modified by being repeatedly irradiated with the electron beam more than ten times. However, when the electron beam irradiation is performed too many times, the edge of the irradiation hole may wear and the irradiation hole may lose its original form. Thus, it remains unchanged that the side surface of the irradiation hole is difficult to modify.

Japanese Laid-open No. 2010-100904 discloses a surface modification apparatus capable of irradiating a side surface of an irradiation hole with an electron beam by using an electrode having an inverse shape to that of the irradiation hole as an anode to form a plasma space between the anode electrode and the irradiation hole, and exciting electrons. In addition, Japanese Patent No. 5187876 discloses a surface modification apparatus capable of irradiating an inner surface of a cylindrical irradiated object with an electron beam by arranging an anode electrode having a plurality of metal projections on an outer circumferential surface in a hollow space of the cylindrical irradiated object to generate plasma, and exciting electrons.

In a method of arranging a cathode electrode to face a side surface of an irradiation hole and irradiating with an electron beam, in order not to cause a spark that lowers surface quality of an irradiated surface, the cathode electrode and the side surface of the irradiation hole are kept sufficiently separate from each other in advance, and a cathode electrode having a smooth surface and a shape unlikely to cause sparks is used. For that reason, the quantity of electrons is small. Thus, the electron beam is to be irradiated after a plasma space is formed between the cathode electrode and the irradiation hole, wherein the cathode electrode is used as an anode electrode.

Accordingly, in the case where the irradiation hole is larger or deeper, since the quantity of electrons is relatively small and irradiation energy is insufficient, irradiation efficiency is low. When the irradiation efficiency is low, since the number of times of irradiation with the electron beam until successful modification of the irradiated surface increases, there is a fear that the edge of the irradiation hole may wear. In addition, depending on the shape or depth of the irradiation hole, it is still impossible to modify the side surface of the irradiation hole.

In the case where a cathode electrode of a shape having a large number of metal projections is used in order to obtain more electrons, a spark is likely to occur, and there is a fear that surface finishing itself cannot be performed due to deterioration of surface quality caused by craters. Particularly in the case where the cathode electrode is used as the anode electrode, a spark is also likely to occur when plasma is generated.

The disclosure provides an electron beam surface modification apparatus having a relatively simple structure and capable of efficiently irradiating a side surface of an irradiation hole with an electron beam to modify the side surface of the irradiation hole. The electron beam surface modification apparatus of the disclosure will be described in detail in the description of the embodiments.

SUMMARY

An electron beam surface modification apparatus of the disclosure includes: a cathode electrode (5E) in a columnar shape, having a plurality of metal projections (50B) over a region of an outer circumferential surface of a base body (50A), the base body (50A) facing at least a side surface of an irradiation hole (7A), the irradiation hole (7A) being formed on an irradiated object (7) disposed in a vacuum chamber (1); and a conductive mesh (5G), being arranged at least between the cathode electrode (5E) and the side surface of the irradiation hole (7A), the conductive mesh (5G)

partially contacting the irradiated object (7) and being set to have a same potential as the irradiated object (7).

The reference numerals inside the parentheses are consistent with the reference numerals shown in the drawings. However, the above reference numerals are attached for convenience of description, and the disclosure is not intended to be limited to the electron beam surface modification apparatus of the embodiment shown in the drawings.

DESCRIPTION OF THE EMBODIMENTS

In the electron beam surface modification apparatus of the disclosure, since the cathode electrode having the plurality of metal projections and capable of releasing a large quantity of electrons is arranged in proximity to the side surface of the irradiation hole, even if no plasma space is present, the electron beam irradiation can be performed with sufficient irradiation energy. As a result, since there is no period for generating plasma, irradiation efficiency is enhanced. In addition, since no anode electrode is required, the structure is relatively simple.

At this moment, while a high voltage is applied between a cathode and a collector, the cathode electrode and the irradiated object are in close proximity to each other, and a spark thus occurs. Since a discharge gap is formed between the cathode electrode and the conductive mesh in contact with the irradiated object, the electrons generated by electric discharge and retaining relatively strong energy move to the irradiated object via the conductive mesh, and the electrons retaining relatively weak energy go through gaps of the conductive mesh and collide with the side surface of the irradiation hole.

Hence, among the large quantity of electrons released from the cathode electrode, only the electrons retaining weak energy that are effective for surface modification collide with and modify the side surface of the irradiation hole, and the surface quality will not be lowered by sparks. Although the number of the electrons going through the conductive mesh is reduced as compared with the quantity of the electrons released from the cathode electrode, there is no fear that the surface quality of the side surface of the irradiation hole may deteriorate or that the edge of the irradiation hole may be damaged. Thus, the electron beam can be repeatedly irradiated. As a result, there is an extremely low probability of failure, and the overall irradiation efficiency of the surface modification step is enhanced.

Figure 1:
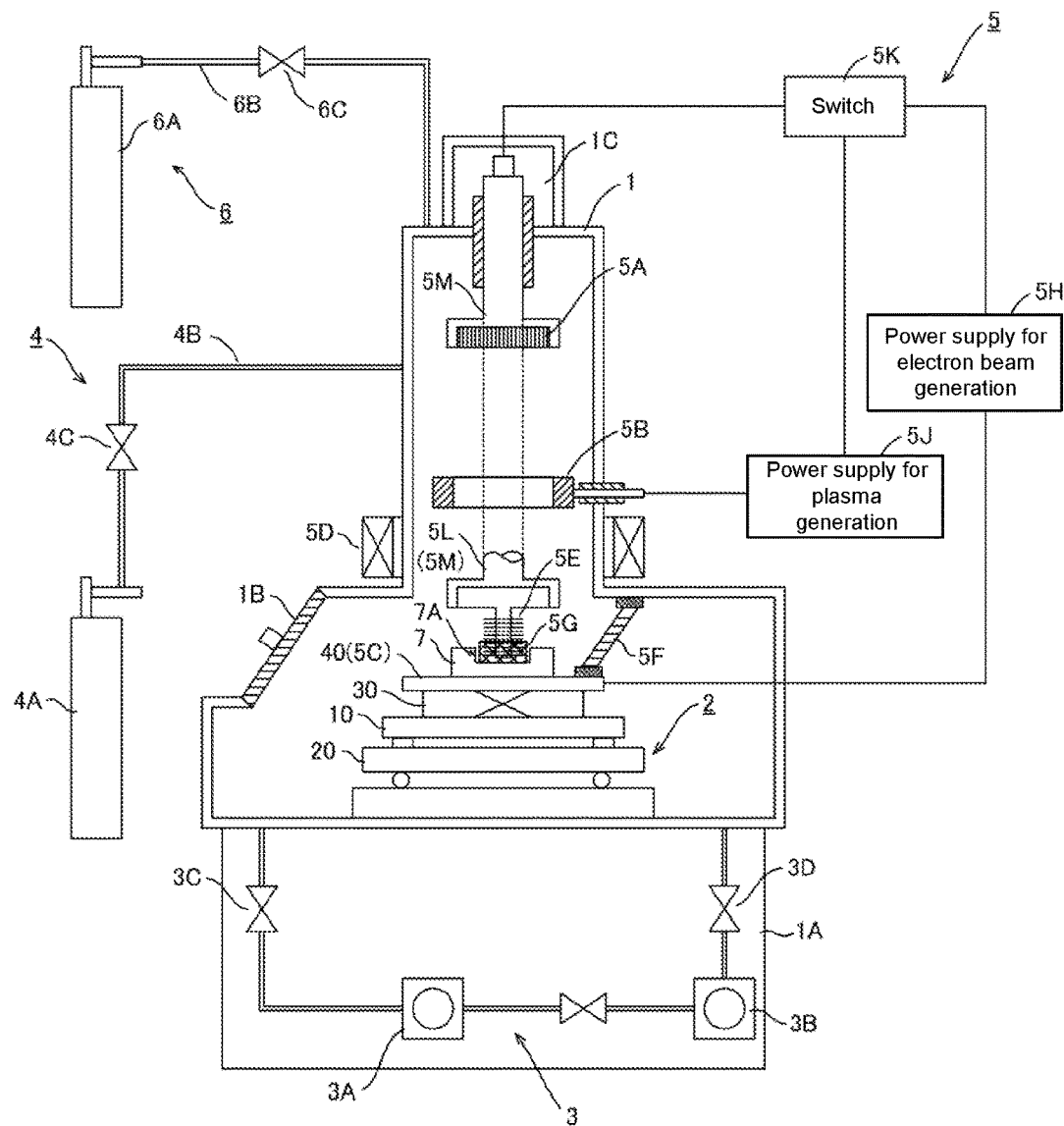
FIG. 1 is a cross-sectional right side view showing an electron beam surface modification apparatus of the disclosure.

FIG. 1 schematically illustrates an embodiment of an electron beam surface modification apparatus of the disclosure. The positions of the attachment devices in FIG. 1 are different from the configuration of the actual electron beam surface modification apparatus. FIG. 1 is a cross-sectional view of the electron beam surface modification apparatus as viewed from the right side, wherein a surface where a sealing door 1B is provided is used as the front face, the sealing door 1B closing an opening of a vacuum chamber 1 for allowing an irradiated object 7 to enter and exit.

The electron beam surface modification apparatus includes the vacuum chamber 1, a moving device 2, a vacuum device 3, a noble gas supply device 4, an electron beam generation device 5, and a purifier 6. The irradiated object 7 is attached and fixed on the moving device 2. In the electron beam surface modification apparatus shown in FIG. 1, an irradiation hole 7A having a flat and circular bottom surface is formed on the irradiated object 7.

The vacuum chamber 1 is a device for accommodating the irradiated object 7. The vacuum chamber 1 is disposed on a base 1A. The vacuum chamber 1 is opened at the front of the electron beam surface modification apparatus in order to allow the irradiated object 7 to enter therein and exit therefrom. The sealing door 1B that closes the opening is provided in the vacuum chamber 1. By closing the sealing door 1B, the vacuum chamber 1 can be sealed.

The moving device 2 is a device for moving the irradiated object 7 in a horizontal uniaxial direction, another horizontal uniaxial direction orthogonal to the aforesaid horizontal uniaxial direction, and a vertical direction. The moving device 2 includes a moving body 10 reciprocally movable in the horizontal uniaxial direction, a moving body 20 reciprocally movable in the another horizontal uniaxial direction orthogonal to the aforesaid horizontal uniaxial direction, and a lifting device 30 reciprocally movable up and down. A table 40 being a mounting base capable of carrying the irradiated object 7 is placed on the lifting device 30.

The vacuum device 3 is a device for reducing pressure in the sealed vacuum chamber 1 to render it in a substantially vacuum state having an air pressure of 0.1 Pa or lower. The vacuum device 3 removes the air from the vacuum chamber 1 by a vacuum pump, i.e., performs so-called vacuum drawing, to reduce the pressure in the vacuum chamber 1. The vacuum pump includes a first pump 3A and a second pump 3B. Specifically, a scroll pump or a rotary pump is suitable for the first pump 3A, and a turbomolecular pump or an oil diffusion pump is suitable for the second pump 3B.

After the air in the vacuum chamber 1 is removed, flow control valves 3C and 3D are closed to maintain the inside of the vacuum chamber 1 in a near vacuum state. The vacuum pump is operating during irradiation with an electron beam, and evacuates the vacuum chamber 1 to maintain the depressurized state in the vacuum chamber 1.

The noble gas supply device 4 is a device for supplying a noble gas into the vacuum chamber 1. The noble gas promotes generation of plasma. The noble gas indicates helium, neon, argon, krypton, xenon, or radon, all being Group 18 elements in the long periodic table. In the disclosure, noble gases and gases having low chemical reactivity, such as nitrogen gas, are referred to as inert gases.

In the disclosure, when the electron beam is irradiated on a side surface of the irradiation hole 7A, since there is no need to promote generation of plasma, if the air pressure in the vacuum chamber 1 is 0.1 Pa or lower and the concentration of oxygen contained in the residual gas is less than 0.3%, the gas is not required to be a noble gas promoting the generation of plasma, but nitrogen gas, for example, can be used. In the electron beam surface modification apparatus of the embodiment, when modifying a flat surface of the irradiated object 7 with no irradiation hole 7A formed thereon, since it is still necessary to generate plasma, argon gas is used.

The noble gas supply device 4 specifically includes a bombe 4A having liquefied argon sealed therein, a pipe 4B connected to the vacuum chamber 1, and a valve 4C opening the bombe 4A. The electron beam surface modification apparatus of the embodiment is designed so as to be capable of maintaining the depressurized state in which the air pressure in the vacuum chamber 1 ranges from 0.03 Pa or higher to 0.1 Pa or lower.

The electron beam generation device 5 includes a disc-shaped cathode electrode 5A being an electron gun, a ring-shaped anode electrode 5B generating plasma, a collector 5C energizing the irradiated object 7, a solenoid 5D forming a magnetic field, and a columnar cathode electrode 5E being an electron gun. The collector 5C is substantially the table 40. The table 40 is grounded to the vacuum chamber 1 by a ground line 5F.

The cathode electrode 5A and the anode electrode 5B are used when the irradiated surface of the irradiated object 7 is roughly flat. In addition, in the case where the irradiation hole 7A is shallow, and the side surface of the irradiation hole 7A can be sufficiently modified even if the electron beam is irradiated from a direction perpendicular to the side surface of the irradiation hole 7A, the electron beam can be irradiated by using the cathode electrode 5A and the anode electrode 5B. The cathode electrode 5E is used when the electron beam is irradiated on the side surface of the irradiation hole 7A formed on the irradiated object 7.

The cathode electrode 5A, and the cathode electrode 5E for irradiating the side surface of the irradiation hole 7A with the electron beam, are not used at the same time. Corresponding to the shape of the irradiated surface of the irradiated object 7, the cathode electrode 5A and the cathode electrode 5E are swapped with each other and attached in the vacuum chamber 1. When the cathode electrode 5E is used, a conductive mesh 5G is disposed between the cathode electrode 5E and the irradiated object 7.

A power supply for electron beam generation 5H includes a high voltage power supply which applies a voltage pulse for generating an electron beam between the cathode electrode 5A and the irradiated object 7 energized by the table 40. A power supply for plasma generation 5J is provided between the cathode electrode 5A and the anode electrode 5B, and supplies a voltage generating plasma within the ring of the ring-shaped anode electrode 5B. The power supply for plasma generation 5J includes an anode switch. A switch 5K switches connection to a power supply.

The cathode electrode 5A is formed by providing a plurality of needle-shaped titanium projections on a substrate circular in cross-section having a predetermined cross-sectional area. In the electron beam generation device 5 of the electron beam surface modification apparatus of the disclosure, the cathode electrode 5A can be regarded as having a large number of electron guns. By the cathode electrode 5A having a relatively large cross-sectional area, particle beams of electrons having a large diameter and smaller energy density can be generated. Hence, it is possible to cause the electron beam to collide with the irradiated surface extensively and uniformly in a single irradiation operation, and a material is modified at an extremely shallow depth of about several µm from the surface.

The cathode electrode 5A is fixed to an upper side in the sealed vacuum chamber 1. A gap switch of the cathode is present in a closed space 1C above the cathode electrode 5A. By arranging the cathode electrode 5A on the upper side of the vacuum chamber 1, the irradiated object 7 can be disposed on the table 40 provided on a lower side in the vacuum chamber 1, separated from the cathode electrode 5A by a predetermined distance in the vertical direction. Hence, the irradiated object 7 can be irradiated linearly in the direction of gravity without variation with an electron beam having a large cross-sectional area.

The anode electrode 5B has a ring shape having a larger inner diameter than the cross-sectional area of the cathode electrode 5A. For example, when a diameter of the cathode electrode 5A is 60 mmϕ, the inner diameter of the anode electrode 5B is 210 mmϕ. The anode electrode 5B generates plasma having a relatively short existence period within the ring. An ionospheric layer of the plasma captures and focuses the electrons released from the cathode electrode 5A.

The purifier 6 forcibly discharges dirty gases out of the vacuum chamber 1, the dirty gases including slag generated from the irradiated surface of the irradiated object 7. The purifier 6 includes a bombe 6A having liquefied nitrogen gas sealed therein, a pipe 6B connected to the vacuum chamber 1, and a valve 6C opening the bombe 6A. The nitrogen gas expels dirty argon gas from the vacuum chamber 1 to make the inside of the vacuum chamber 1 clean. In the electron beam surface modification apparatus of the embodiment, when the electron beam is irradiated on the side surface of the irradiation hole 7A, there is no need to generate plasma. Thus, in place of the argon gas supplied from the noble gas supply device 4, nitrogen gas can be supplied from the purifier 6.

Figure 2:
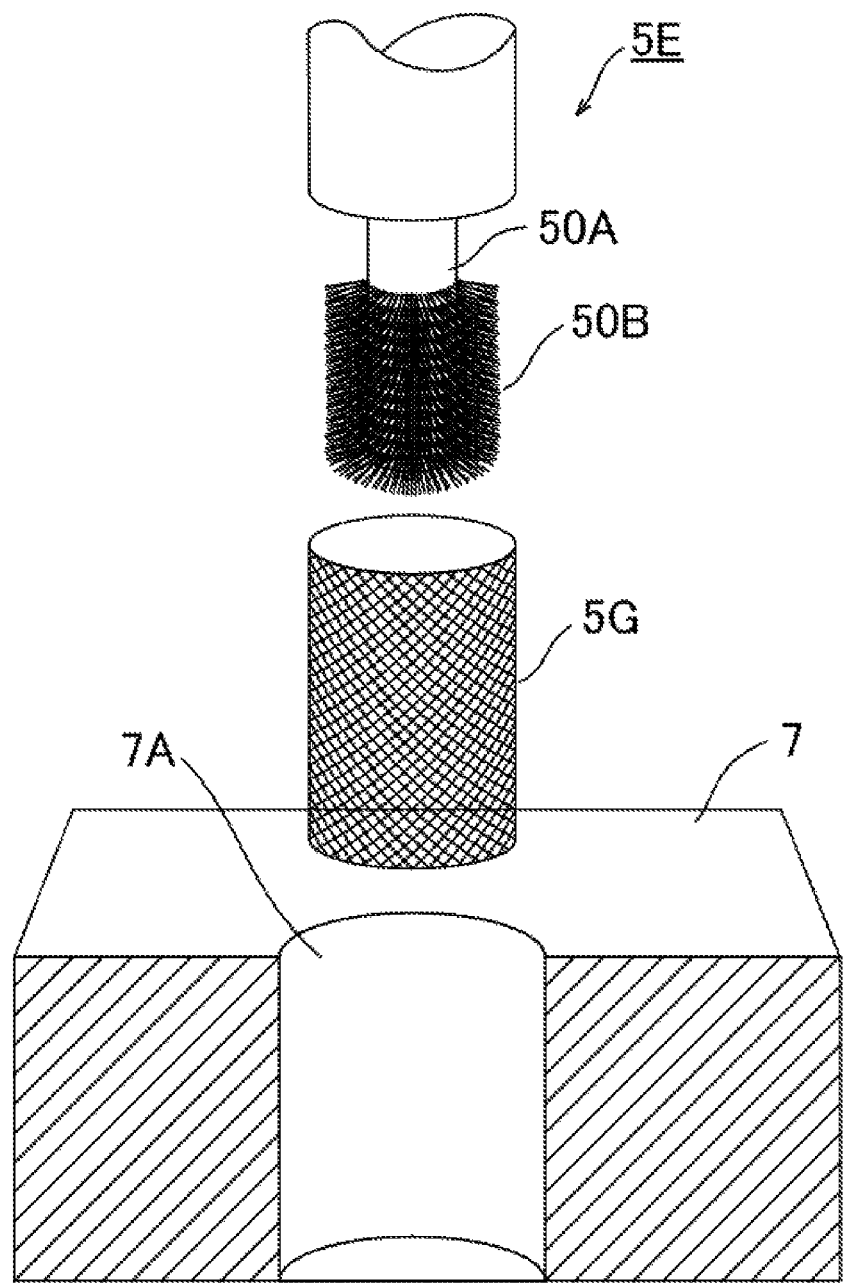
FIG. 2 is a diagram of an irradiation hole in which a cathode electrode and a conductive mesh of the disclosure are shown.

FIG. 2 schematically shows the irradiated object 7, the cathode electrode 5E, and the conductive mesh 5G shown in FIG. 1. In the irradiation hole 7A shown in FIG. 2, the bottom surface is circular and flat, and the side surface has a perpendicular shape. In FIG. 2, the irradiated object 7 is shown by a cross-sectional view cut from the center of the irradiation hole 7A, so that the side surface and bottom surface of the irradiation hole 7A can be seen.

The cathode electrode 5E is formed by providing a plurality of metal projections 50B approximately evenly all over a region of an outer circumferential surface of a base body 50A, the base body 50A facing at least the side surface of the irradiation hole 7A formed on the irradiated object 7. The metal projections 50B are desirably made of a material which easily releases electrons and hardly wears. The material of the metal projections 50B of the cathode electrode 5E of the electron beam surface modification apparatus of the embodiment is titanium.

In accordance with the cross-sectional shape and size of the irradiation hole 7A, a plurality of types of cathode electrodes 5E are prepared. The cathode electrode 5E has the metal projections 50B that induce the release of electrons, and may be of any form as long as it is capable of obtaining a wide range of electron beams between itself and the side surface of the irradiation hole 7A. For example, the cross-sectional shape of the base body 50A in the horizontal direction may be a polygon. In addition, for example, the metal projections 50B may be provided only on half the outer circumferential surface of the base body 50A. Alternatively, the metal projections 50B may be of a shape resembling needles of a kenzan (spiky frog) instead of a shape resembling metal hair of a metallic brush shown in FIG. 2.

Since electrons are released from the metal projections 50B of the cathode electrode 5E, the number of the metal projections 50B is advantageously as large as possible. In addition, the metal projections 50B are desirably provided as evenly as possible. When a specific irradiated surface of the irradiation hole 7A is aimed to be irradiated with the electron beam, the irradiated object 7 is moved horizontally by the moving device 2 to shorten a distance between the cathode electrode 5E and the specific irradiated surface, so that the electron beam can more easily emitted to the specific irradiated surface.

The cathode electrode 5E is attached to an electrode holding portion of a cathode holder 5M shown in FIG. 1 by a swap with the cathode electrode 5A by detaching the cathode electrode 5A from the electrode holding portion. The cathode holder 5M, for example, includes an expansion and contraction mechanism of a support (not illustrated) formed by fitting a plurality of cylinders so that they overlap, and is capable of lowering the cathode electrode 5E to the height of the irradiation hole 7A and arranging the cathode electrode 5E to face the irradiation hole 7A by extending the support in the direction of the irradiated object 7.

A socket terminal is provided on an electrode attachment portion of the cathode holder 5M. The cathode electrode 5E is energized without wiring work only by being attached to the electrode attachment portion. By the same gap switch as the cathode electrode 5A, a voltage supplied from the power supply for electron beam generation 5H is applied to the cathode electrode 5E.

By attaching a cathode holder 5L having a longer support than that of the cathode holder 5M to the upper side of the vacuum chamber 1, the cathode electrode 5E can also be arranged to face the side surface of the irradiation hole 7A. Specifically, the cathode electrode 5E is attached to the electrode holding portion of the cathode holder 5L shown in FIG. 1, and by attaching and fixing the cathode holder 5L just to the position from which the cathode holder 5M is removed from the upper side of the vacuum chamber 1, the cathode electrode 5E can be energized without wiring work. By the same gap switch as the cathode electrode 5A, the voltage supplied from the power supply for electron beam generation 5H is applied to the cathode electrode 5E.

When the support of the cathode holder 5M is extended in the direction of the irradiated object 7, or when the cathode holder 5L is attached and fixed to the upper side of the vacuum chamber 1, both the support of the cathode holder 5M and the support of the cathode holder 5L pass through within the ring of the anode electrode 5B. Thus, there is no need to remove the anode electrode 5B. Moreover, when the length of the cathode holder 5L can be adjusted in advance in accordance with the depth of the irradiation hole 7A, the number of the cathode holder 5L that has to be prepared beforehand can be decreased.

The cathode electrode 5E in the electron beam surface modification apparatus of the embodiment has a large quantity of the metal projections 50B that release electrons, and the distance between the cathode electrode 5E and the side surface of the irradiation hole 7A is short. Thus, even if there is no ionospheric layer of plasma for exciting electrons, an electron beam having sufficient irradiation energy can still be irradiated, and an anode electrode is unneeded. Hence, when generating plasma, there is no need to provide an anode in proximity to the side surface of the irradiation hole 7A, and the electron beam generation device 5 has a relatively simple structure. In addition, since there is no period for generating plasma, the time required for one cycle of electron beam irradiation can be reduced, and irradiation efficiency is enhanced.

In the electron beam surface modification apparatus of the embodiment, the conductive mesh 5G is arranged at least between the cathode electrode 5E and the side surface of the irradiation hole 7A. The conductive mesh 5G partially contacts the irradiated object 7 and is set to have a same potential as the irradiated object 7. The conductive mesh 5G is basically provided so as to surround the metal projections 50B of the cathode electrode 5E in such a way as to not cause a short circuit when contacting the metal projections 50B. A material of the conductive mesh 5G is a non-magnetic material which does not generate a magnetic field, and is desirably stainless steel or titanium which is hardly damaged by heat.

If the distance between the cathode electrode 5E and the irradiated object 7 is short, when a high voltage is applied to the cathode electrode 5E, dielectric breakdown may occur between the cathode electrode 5E and the irradiated object 7 and cause a spark, and the electron beam irradiation becomes difficult. Since the conductive mesh 5G contacts the irradiated object 7 and has the same potential as the irradiated object 7, an electric discharge occurs between the cathode electrode 5E and the conductive mesh 5G. The electrons generated by the electric discharge and retaining strong energy pass through the conductive mesh 5G to reach the irradiated object 7, only the electrons appearing from the metal projections 50B and retaining weak energy collide with the side surface of the irradiation hole 7A, and the electron beam irradiation is reliably performed.

Although surface quality of the irradiation hole 7A is not measured by accurate experiments, theoretically, in the case of a cylindrical stainless steel conductive mesh, if the mesh is 1 mm to 12 mm in size, and lines forming the mesh are 0.1 mm$\phi$ to 1 mm$\phi$ in diameter, it is inferred that the side surface can be finished to a required surface quality at a depth of several μm.

Although the electron beam surface modification apparatus of the above-described embodiment has been shown by several examples, modifications thereto are possible within a scope not contrary to the technical idea of the disclosure. For example, as an embodiment of a cathode electrode in which a plurality of metal projections are provided evenly on a hemispherical base body, the entire surface of a hemispherical irradiation hole can be irradiated with the electron beam. In addition, like the electron beam surface modification apparatus of the embodiment, it can be combined with a well-known electron beam surface modification apparatus.

INDUSTRIAL APPLICABILITY

Basically, the electron beam surface modification apparatus of the disclosure is capable of modifying a surface of a conductive material, and is extensively effective in surface modification of industrial products such as molds or parts of metals, ceramics and plastics. It can be particularly expected that a surface of an irradiated object on which a deep irradiation hole including a rib is formed is modified. The disclosure contributes to quality enhancement and development of the industrial products.

What is claimed is:

1. An electron beam surface modification apparatus configured to perform a surface modification of a side surface of an irradiation hole being formed on an irradiated object, and the electron beam surface modification apparatus comprising:

a vacuum chamber, accommodating the irradiated object;

a cathode electrode, being surrounded by the irradiation hole, and the cathode electrode having:

a base body, facing at least the side surface of the irradiation hole; and a plurality of metal projections over a region of an outer circumferential surface of the base body; and a conductive mesh, being arranged at least between the cathode electrode and the side surface of the irradiation hole, the conductive mesh partially contacting the irradiated object and being set to have a same potential as the irradiated object, wherein the conductive mesh is disposed to face an entire region of the side surface of the irradiation hole.

2. The electron beam surface modification apparatus according to claim 1, wherein
the plurality of metal projections are provided evenly all over the region of the outer circumferential surface of the base body.

3. The electron beam surface modification apparatus according to claim 1, wherein
the plurality of metal projections have a shape of a brush.

4. The electron beam surface modification apparatus according to claim 1, wherein
the plurality of metal projections are made of titanium.

5. The electron beam surface modification apparatus according to claim 1, wherein
the conductive mesh is provided so as to surround the plurality of metal projections.

6. The electron beam surface modification apparatus according to claim 1, wherein
the conductive mesh is made of stainless steel or titanium.

7. The electron beam surface modification apparatus according to claim 1, further comprising:
a cathode holder, having a lower end to which the cathode electrode is attached,
wherein the cathode holder includes an expansion and contraction mechanism which is capable of lowering the cathode electrode to a height of the irradiation hole.

8. The electron beam surface modification apparatus according to claim 7, wherein
the expansion and contraction mechanism is formed by fitting a plurality of cylinders so that the plurality of cylinders are overlapped.

\* \* \* \* \*